(12) United States Patent
Murakami

(10) Patent No.: US 10,084,014 B2
(45) Date of Patent: Sep. 25, 2018

(54) ARRAY SUBSTRATE FOR DISPLAY APPARATUS, DISPLAY APPARATUS, METHOD FOR PRODUCING ARRAY SUBSTRATE FOR DISPLAY APPARATUS, AND METHOD FOR PRODUCING DISPLAY APPARATUS

(71) Applicant: Mitsubishi Electric Corporation, Tokyo (JP)

(72) Inventor: Katsuaki Murakami, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/455,572

(22) Filed: Mar. 10, 2017

(65) Prior Publication Data

US 2017/0271379 A1    Sep. 21, 2017

(30) Foreign Application Priority Data

Mar. 18, 2016    (JP) .................. 2016-055008

(51) Int. Cl.
*H01L 27/12*    (2006.01)
*H01L 27/24*    (2006.01)

(52) U.S. Cl.
CPC ........ *H01L 27/2418* (2013.01); *H01L 27/124* (2013.01); *H01L 27/127* (2013.01); *H01L 27/1225* (2013.01); *H01L 27/1262* (2013.01)

(58) Field of Classification Search
CPC ............................ H01L 27/127; H01L 27/124
See application file for complete search history.

(56) References Cited

U.S. PATENT DOCUMENTS

| 2008/0035920 | A1  | 2/2008  | Takechi et al. |
| 2015/0311233 | A1  | 10/2015 | Hsin et al. |
| 2016/0111547 | A1* | 4/2016  | Yamazaki ........... H01L 29/7869 257/43 |
| 2017/0363905 | A1* | 12/2017 | Katsuta ............. G02F 1/133504 |

FOREIGN PATENT DOCUMENTS

| JP | H05-088191 A | 4/1993 |
| JP | H05-232496 A | 9/1993 |
| JP | H05-249488 A | 9/1993 |
| JP | H11-190858 A | 7/1999 |

(Continued)

*Primary Examiner* — Jay C Chang
*Assistant Examiner* — Mikka Liu
(74) *Attorney, Agent, or Firm* — Studebaker & Brackett PC

(57) ABSTRACT

A technique disclosed in the present specification relates to reducing failures at repairing a bright pixel defect to be a dark pixel. An array substrate for a display apparatus, in this technique includes an insulating substrate that is transparent, an insulating film at least partly disposed on an upper surface of the insulating substrate and containing silicon oxide or metal oxide as a main component, a first conductive film, a second conductive film spaced apart from the first conductive film, and an insulator portion that is in direct contact with and extends between the first conductive film and the second conductive film. The insulator portion is formed by converting an oxide semiconductor film into an insulator. The insulator portion includes an upper surface or lower surface in direct contact with the insulating film.

12 Claims, 7 Drawing Sheets

(56) References Cited

FOREIGN PATENT DOCUMENTS

| | | |
|---|---|---|
| JP | 2008-040343 A | 2/2008 |
| JP | 2009-151094 A | 7/2009 |
| JP | 2011-187509 A | 9/2011 |
| JP | 2015-211212 A | 11/2015 |
| WO | 2017/002655 A1 | 1/2017 |

* cited by examiner

F I G. 3
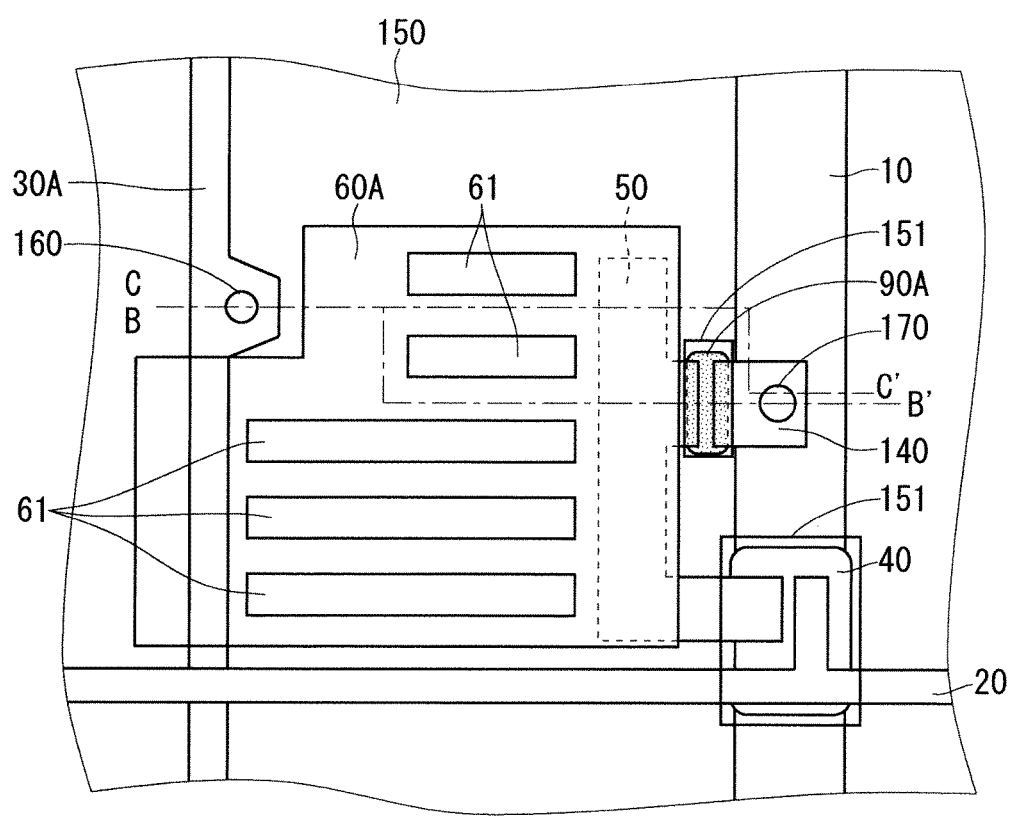

F I G . 1 1
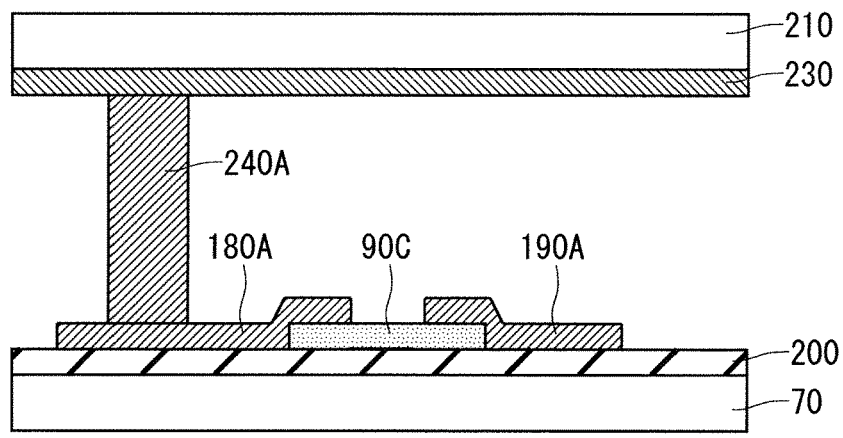
F I G . 1 2
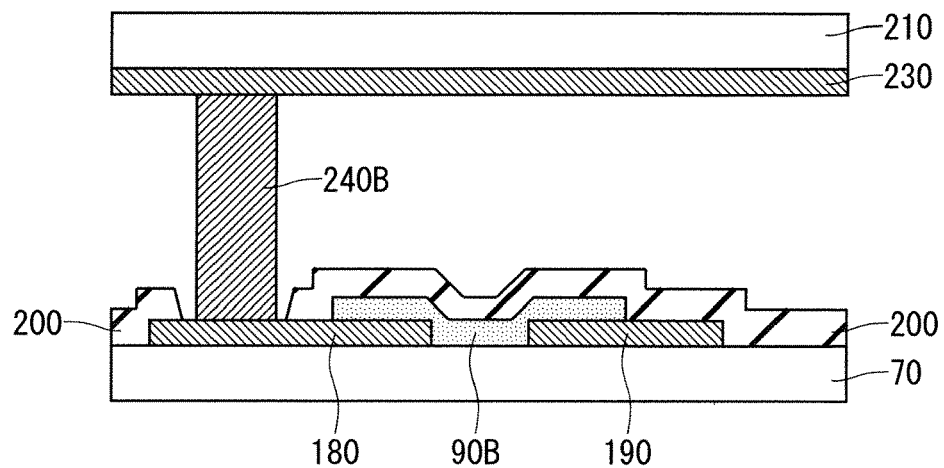
F I G . 1 3
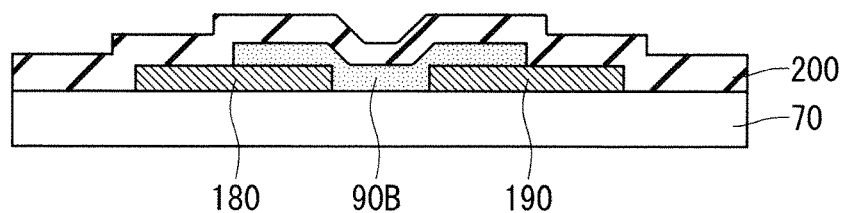

ARRAY SUBSTRATE FOR DISPLAY APPARATUS, DISPLAY APPARATUS, METHOD FOR PRODUCING ARRAY SUBSTRATE FOR DISPLAY APPARATUS, AND METHOD FOR PRODUCING DISPLAY APPARATUS

BACKGROUND OF THE INVENTION

Field of the Invention

A technique disclosed in the present specification relates to, for instance, an array substrate of semiconductors such as a plurality of semiconductor switching elements, used for a display apparatus, to a display apparatus, to a method for producing an array substrate for a display apparatus, and to a method for producing a display apparatus.

Description of the Background Art

Display apparatuses including liquid crystal display apparatuses have been recently used in devices for various applications. Meanwhile, the market has required a higher quality of the display apparatuses.

In particular, the market has strictly required the quality where a display apparatus with only one bright pixel defect, i.e., a pixel that is constantly bright is judged to be a defective item. Accordingly, productivity needs to be addressed.

To meet the requirement for quality and the productivity at the same time, one effective way now used is repairing bright pixel defects to be dark pixel defects, i.e., pixels that are constantly dark.

For instance, reference is made to an array with a twisted nematic (TN) structure. Disclosed is a method for repairing an applicable pixel to be a constantly-dark pixel (e.g., see Japanese Patent Application Laid-Open No. 5-249488). Such a method includes irradiating, with a laser beam, a location where a gate wire and a pixel electrode overlap each other and then short-circuiting (fusing) the gate wire and the pixel electrode so as to constantly input a gate potential to the pixel electrode.

Reference is now made to an array with a fringe field switching (FFS) structure. Disclosed is another method for repairing the applicable pixel to be the constantly-dark pixel (for instance, see Japanese Patent Application Laid-Open No. 2009-151094). Such a method includes irradiating, with a laser beam, a location where a common wire and the pixel electrode overlap each other and then short-circuiting (fusing) the common wire and the pixel electrode so as to constantly input a common potential to the pixel electrode.

In these methods for repair, variations in laser power can cause a power shortage or a power excess. The power shortage fails to achieve a sufficient, electrical conduction because of insufficient short-circuit by laser irradiation. On the other hand, the power excess can damage the periphery of a location to be repaired and a sublayer pattern of the location, or can cause metal patterns in the location irradiated with the laser beam to have different shapes from each other or to peel, to thus result in a failure in repair. Additionally, a seemingly-successful repair can merely provide a very partial conductive path, to thus result in a broken wire again on the market after the shipment due to deterioration over time. As such, the repair does not succeed enough and the connection is not reliable enough.

SUMMARY OF THE INVENTION

The technique disclosed in the present specification is provided to solve these problems. This technique relates to reducing failures at repairing a bright pixel defect to be a dark pixel.

An array substrate for a display apparatus according to one aspect of the technique disclosed in the present specification includes an insulating substrate that is transparent, an insulating film, a first conductive film, a second conductive film, and an insulator portion. The insulating film is at least partly disposed on an upper surface of the insulating substrate and contains silicon oxide or metal oxide as a main component. The second conductive film is spaced apart from the first conductive film. The insulator portion is in direct contact with and extends between the first conductive film and the second conductive film. The insulator portion is formed by converting an oxide semiconductor film into an insulator. The insulator portion includes an upper surface or lower surface in direct contact with the insulating film.

A display apparatus according to another aspect of the technique disclosed in the present specification includes the array substrate for a display apparatus.

A method for producing an array substrate for a display apparatus, according to still another aspect of the technique disclosed in the present specification includes preparing an insulating substrate that is transparent, forming at least a part of an insulating film containing silicon oxide or metal oxide as a main component, on an upper surface of the insulating substrate, forming a first conductive film, forming a second conductive film in a position spaced apart from the first conductive film, and forming an insulator portion in direct contact with the first conductive film and the second conductive film so as to extend to the first conductive film and the second conductive film. The insulator portion is formed by converting an oxide semiconductor film into an insulator. The insulator portion includes an upper surface or lower surface in direct contact with the insulating film.

A method for producing a display apparatus, according to yet another aspect of the technique disclosed in the present specification includes the method for producing an array substrate for a display apparatus.

Irradiating the oxide semiconductor film converted into the insulator with ultraviolet rays enables a conduction between one conductive film and the other conductive film each in direct contact with the oxide semiconductor film.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a schematically-illustrated plan view of a circuit configuration of on an array substrate used for a display apparatus according to a preferred embodiment;

FIG. 11 is a schematically-illustrated cross-sectional view of a structure of a display apparatus according to a preferred embodiment;

FIG. 12 is a schematically-illustrated cross-sectional view of another structure of the display apparatus according to the preferred embodiment; and FIG. 13 is a schematically-illustrated cross-sectional view of a structure of a display apparatus according to a preferred embodiment.

DESCRIPTION OF THE PREFERRED EMBODIMENTS

Preferred embodiments will be described with reference to the accompanying drawings.

The drawings are schematic. Thus, mutual relationships between the sizes and positions of images that are illustrated in different drawings are not necessarily accurate, and thus can be changed as appropriate.

Throughout the following descriptions, like components are denoted by the same symbols, and are also provided with the same names and the same functions. Hence, detailed descriptions of them can be omitted.

Throughout the following descriptions, the use of terms, such as "top", "under", "side", "bottom", "front", and "back", that indicate specific positions and specific directions is merely for convenience in easy understanding of the preferred embodiments. These terms thus have nothing to do with actual directions when the embodiments are actually implemented.

First Preferred Embodiment

The following describes an array substrate for a display apparatus, a display apparatus, a method for producing an array substrate for a display apparatus, and a method for producing a display apparatus, according to the present preferred embodiment.

<Array Substrate for Display Apparatus>

Figure 1:
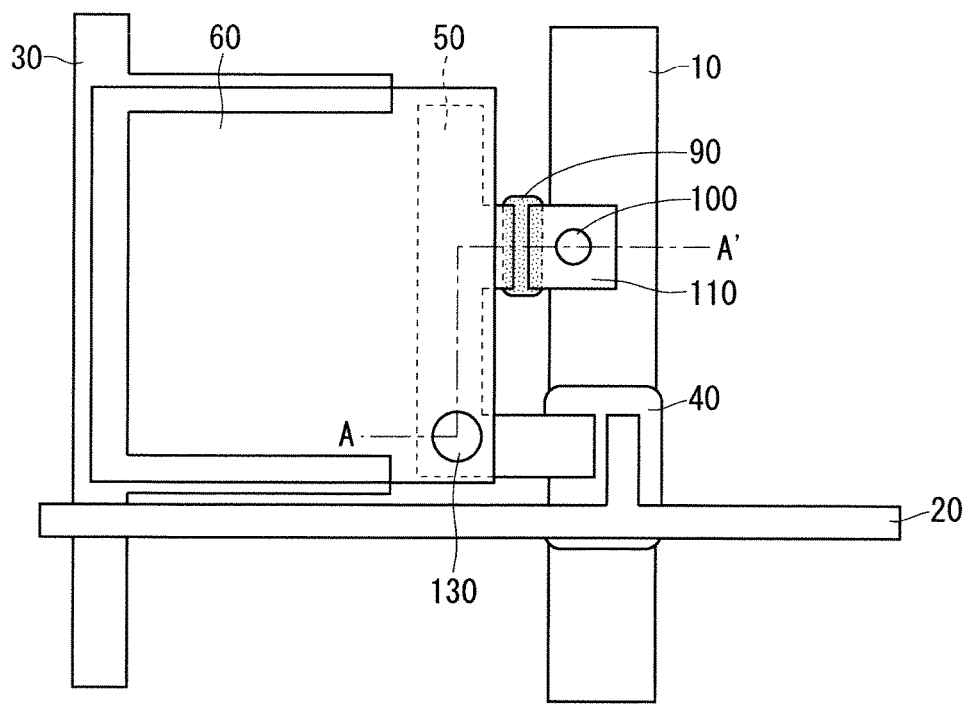
FIG. 1 is a schematically-illustrated plan view of a circuit configuration on an array substrate used for a display apparatus according to a preferred embodiment.
Figure 2:
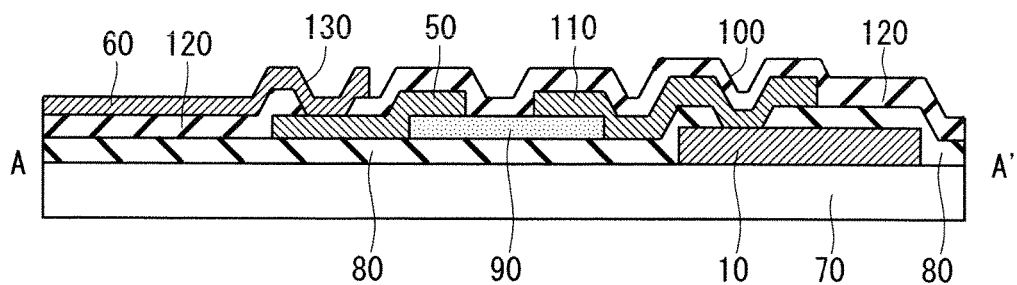
FIG. 2 is a cross-sectional view of the circuit configuration illustrated in FIG. 1, corresponding to the cross section A-A'.

FIG. 1 is a schematically-illustrated plan view of a circuit configuration on an array substrate used for a display apparatus according to the present preferred embodiment. FIG. 2 is a cross-sectional view of the circuit configuration illustrated in FIG. 1, corresponding to the cross section A-A'.

As illustrated in FIG. 1, the display apparatus includes a display region provided with a plurality of gate wires 10 and a plurality of source wires 20. The plurality of gate wires 10 each extend in an X-direction and is disposed in a Y-direction. The plurality of source wires 20 each extend in the Y-direction while intersecting with the gate wire 10 and is disposed in the X-direction.

The display region of the display apparatus also includes a plurality of common wires 30 each spaced apart from the gate wire 10 at a regular interval. The common wires 30 are electrically connected to each other.

The display region of the display apparatus also includes TFTs 40, which are semiconductor switching elements, at intersections of the gate wires 10 and source wires 20. The TFTs 40 are each connected to the gate wire 10, the source wire 20, and the drain electrode 50.

The drain electrodes 50 of the TFTs 40 are connected to pixel electrodes 60. Additionally, portions in which the pixel electrodes 60 and the common wires 30 overlap each other in a plan view each contain a holding capacity.

All the intersections of the plurality of gate wires 10 and plurality of the source wires 20 have a matrix of the circuit configuration illustrated in FIG. 1. That is, FIG. 1 illustrates the circuit configuration at one of these intersections.

As illustrated in FIGS. 1 and 2, the array substrate for a display apparatus includes a transparent, insulating glass substrate 70 and the gate wires 10 and common wires 30 disposed on the glass substrate 70.

As illustrated in FIGS. 1 and 2, the array substrate for a display apparatus includes an insulating film 80 that covers the glass substrate 70, gate wires 10, and common wires 30. The array substrate for a display apparatus also includes repair oxide-patterns 90 disposed on the insulating film 80.

The array substrate for a display apparatus includes the drain electrodes 50 each partly covering the repair oxide-pattern 90, and gate-wire connection patterns 110 each partly covering the repair oxide-pattern 90. The gate-wire connection patterns 110 are each in contact with the gate wire 10 at a contact hole 100.

<Method for Producing Array Substrate for Display Apparatus>

The following describes a method for producing an array substrate for a display according to the present preferred embodiment.

The first step is forming a metal thin film on the upper surface of the transparent, insulating glass substrate 70 using a sputtering apparatus. The metal thin film then undergoes a photolithography process, an etching process, and further a resist removal process so as to form the gate wire 10 (see FIGS. 1 and 2) and the common wire 30 (see FIG. 1).

The following step is forming, using a chemical-vapor-deposition (i.e., CVD) apparatus, the insulating film 80 made of a material such as silicon oxide ($SiO_2$) or metal oxide on the entire surface of the insulating glass substrate 70, as illustrated in FIG. 2.

The following step is forming, using the sputtering apparatus, about −80 nm-thick InGaZnO, which is an oxide semiconductor, under a condition in which InGaZnO has a property of a semiconductor, on the entire surface of the insulating film 80 so as to form a semiconductor portion on the entire surface to thus form an inorganic film. Specifically, InGaZnO is formed to have an oxygen partial pressure of about 9% with respect to argon (Ar) in sputtering.

The following step is a photolithography step for keeping the semiconductor portion in which a TFT is formed so as to form a resist in a TFT portion.

The following step is a plasma process using a nitrogen monoxide ($N_2O$) gas ($N_2O$ plasma process) to convert InGaZnO from a semiconductor into an insulator so as to form an inorganic film (repair oxide-pattern 90) that includes an insulator portion in a resist-uncovered portion. The next step is removing the resist.

The semiconductor has a resistivity of more than $1 \times 10^{-2}$ $\Omega \cdot cm$ and less than $1 \times 10^6$ $\Omega \cdot cm$. The semiconductor more preferably has a resistivity of $1 \times 10^2$ $\Omega \cdot cm$ or more and $1 \times 10^5$ $\Omega \cdot cm$ or less.

The insulator has a resistivity of $1\times10^6$ Ω·cm or more. The insulator more preferably has a resistivity of $1\times10^7$ Ω·cm or more.

In the present preferred embodiment, as illustrated in FIG. 1, the oxide semiconductor is formed in the TFT 40 necessary to form the display apparatus, and also constitutes a repair pattern (repair oxide-pattern 90) in a position spaced apart from the TFT 40.

The oxide semiconductor is formed under a condition in which the oxide semiconductor has a characteristic of a semiconductor, necessary to achieve a characteristic of a TFT. At this time, the repair oxide-pattern 90 has a characteristic of a semiconductor similar to that of the TFT 40.

The following step is forming a metal thin film using the sputtering apparatus, followed by forming the source wire 20 (see FIG. 1) and the drain electrode 50 (see FIGS. 1 and 2) using the metal thin film.

At this time, as illustrated in FIGS. 1 and 2, a part of the drain electrode 50 and a part of repair oxide-pattern 90, which is previously formed, are brought into direct contact with each other. Additionally, the contact hole 100 is formed in a position in the insulating film 80, corresponding to the gate wire 10 so that the repair oxide-pattern 90 and the gate wire 10, whose purpose is different from that of the drain electrode 50, are connected to each other (see FIGS. 1 and 2). The following step is forming the gate-wire connection pattern 110 that extends from the contact hole 100 to the repair oxide-pattern 90. The gate-wire connection pattern 110 is in direct contact with a part of the repair oxide-pattern 90 (see FIGS. 1 and 2).

The following step is forming an insulating film 120 on the entire surface of the substrate as illustrated in FIG. 2, followed by forming a contact hole 130 in a position in the insulating film 120, corresponding to the drain electrode 50, followed by forming a pixel electrode 60 that contains, for instance, ITO and extends from the contact hole 130, where the pixel electrode 60 is a transparent electrode (see FIGS. 1 and 2).

Through these steps, the display apparatus illustrated in FIGS. 1 and 2 is produced.

As illustrated in FIGS. 1 and 2, the display apparatus according to the present preferred embodiment is configured such that the contact hole 100 is disposed in the insulating film 80 on the gate wire 10, and that a potential of the gate wire 10 is supplied to the gate-wire connection pattern 110 in an upper layer. The display apparatus is also configured such that the gate-wire connection pattern 110 and the drain electrode 50 are not in direct contact with each other and are adjacent to each other.

The display apparatus is further configured such that the repair oxide-pattern 90, which has an insulating property and includes the oxide semiconductor, is disposed in a position in which the repair oxide-pattern 90 is in contact with both gate-wire connection pattern 110 and drain electrode 50.

The structure illustrated in FIG. 2 is configured such that the gate-wire connection pattern 110 and the drain electrode 50 include the metal thin film in the same layer, and that the repair oxide-pattern 90 is disposed under this layer.

The structure illustrated in FIG. 2 is also configured such that the repair oxide-pattern 90 is provided not to overlap the gate wire 10 in a plan view. The structure illustrated in FIG. 2 is also configured such that repair oxide-pattern 90 includes a region that does not overlap the drain electrode 50 and the gate-wire connection pattern 110 in a plan view.

The structure illustrated in FIG. 2 is also configured such that no other metal thin film patterns that obstacle light exist in the upper surface or lower surface of the repair oxide-pattern 90. That is, the structure illustrated in FIG. 2 is configured such that a region that does not overlap the drain electrode 50 and gate-wire connection pattern 110 on the repair oxide-pattern 90 in a plan view does not overlap the other metal thin film patterns in a plan view, either.

<Method for Repair>

The following describes a method for repair according to the present preferred embodiment.

When an abnormality that causes a bright pixel defect is detected in an inspection step, the repair oxide-pattern 90 of an applicable pixel with the abnormality is irradiated with ultraviolet rays using an ultraviolet laser. The ultraviolet rays are radiated from the glass substrate toward the inorganic film, i.e., from the back surface of the glass substrate 70 toward the repair oxide-pattern 90. The ultraviolet rays passes through the glass substrate 70 so as to be radiated to the repair oxide-pattern 90, which is an insulating film and is the insulator portion of the inorganic film.

Irradiating, with the ultraviolet rays, a portion in which the insulator portion formed by converting an oxide semiconductor film into the insulator, and the insulating film that is a silicon oxide ($SiO_2$) film are in direct contact with each other leads to a particularly effective excitation of electron carriers of the oxide semiconductor film to thus reduce the resistivity of the oxide semiconductor film. Consequently, the insulator portion is converted into a conductor to constitute a conductor portion.

The conductor portion, which is the oxide semiconductor converted into the conductor, is in direct contact with the drain electrode 50 that is a first conductive film and with the gate-wire connection pattern 110 that is a second conductive film. Thus, the drain electrode 50, which is the first conductive film, and the gate-wire connection pattern 110, which is the second conductive film, are electrically conducted through the oxide semiconductor film converted into the conductor.

As a result, repair of connection is enabled. Additionally, the drain electrode 50, which is the first conductive film, and the gate-wire connection pattern 110, which is the second conductive film, and the oxide semiconductor film converted into the conductor are in close, direct contact with each other. Such a configuration reduces faulty repairs when compared with a conventional configuration.

Here, the conductor has a resistivity of $1\times10^{-2}$ Ω·cm or less. The conductor more preferably has a resistivity of $1\times10^{-3}$ Ω·cm or less.

For the irradiation with the ultraviolet rays, other examples include irradiation using an ultraviolet lamp and irradiation using an ultraviolet light emitting diode (i.e., LED).

In this case, a peripheral structure, such as the insulating film 80 or the insulating film 120 may be irradiated with the ultraviolet rays along with the ultraviolet irradiation of the repair oxide-pattern 90. However, the irradiation is avoided, excluding the TFT 40 of a target pixel for repair and the target pixel for repair.

As a result of the electrical conduction, a gate potential applied to the gate-wire connection pattern 110 is supplied to the drain electrode 50 and further to the pixel electrode 60, which is connected to the drain electrode 50, via the repair oxide-pattern 90 having high conductivity.

The gate potential is supplied to the pixel electrode 60. Thus, a liquid crystal display apparatus having a characteristic of normally-white display is configured such that the applicable pixel is forcedly displayed as a constantly-dark pixel, for instance. In this way, the bright pixel defect is repaired to be a dark pixel defect.

In the present preferred embodiment, the repair oxide-pattern 90 is provided not to overlap the other metal thin film patterns in a plan view so that the repair is performed by the ultraviolet irradiation from both upper surface (from the film-formation layer) and lower surface (from the glass substrate).

However, when a repair by the ultraviolet irradiation from the lower surface is not needed, the repair oxide-pattern 90 may be provided to overlap, in a plan view, the gate wire 10 or a wire that includes a metal thin film such as the drain electrode 50, in the lower surface of the repair oxide-pattern 90, in order to allocate a wide transparent region.

Reference is made to the distance between the gate-wire connection pattern 110 and the drain electrode 50, illustrated in the present preferred embodiment, and to the width of the gate-wire connection pattern 110 and pattern width of the drain electrode 50, illustrated in the present preferred embodiment. A minimum reduction in aperture ratio and also a maximum high resistance of a normal pixel are desirable. In view of this, the distance between the gate-wire connection pattern 110 and the drain electrode 50 is, for instance, 1 µm or more and 10 µm or less. Additionally, the width of the gate-wire connection pattern 110 and the pattern width of the drain electrode 50 are, for instance, 2 µm or more and 20 µm or less.

However, the distance between the gate-wire connection pattern 110 and the drain electrode 50 and the widths of the patterns is adjustable in conformance with a connection resistance necessary in the repair.

The repair oxide-pattern 90 illustrated in the present preferred embodiment is independently disposed in a minimum number of regions required for the repair by the ultraviolet irradiation.

Second Preferred Embodiment

The following describes an array substrate for a display apparatus, a display apparatus, a method for producing an array substrate for a display apparatus, and a method for producing a display apparatus, according to a second preferred embodiment. Like components described in the previous preferred embodiment are denoted by the same symbols, and a detailed description of the like components is omitted as necessary.

<Array Substrate for Display Apparatus>

Figure 4:
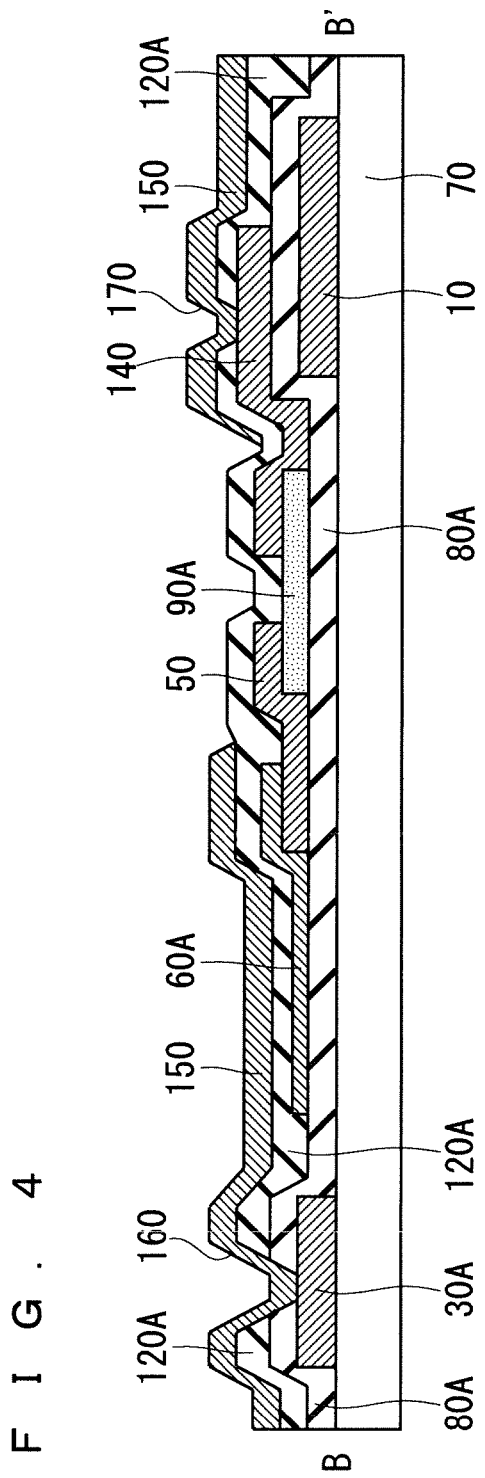
FIG. 4 is a cross-sectional view of the circuit configuration illustrated in FIG. 3, corresponding to the cross-section B-B'.
Figure 5:
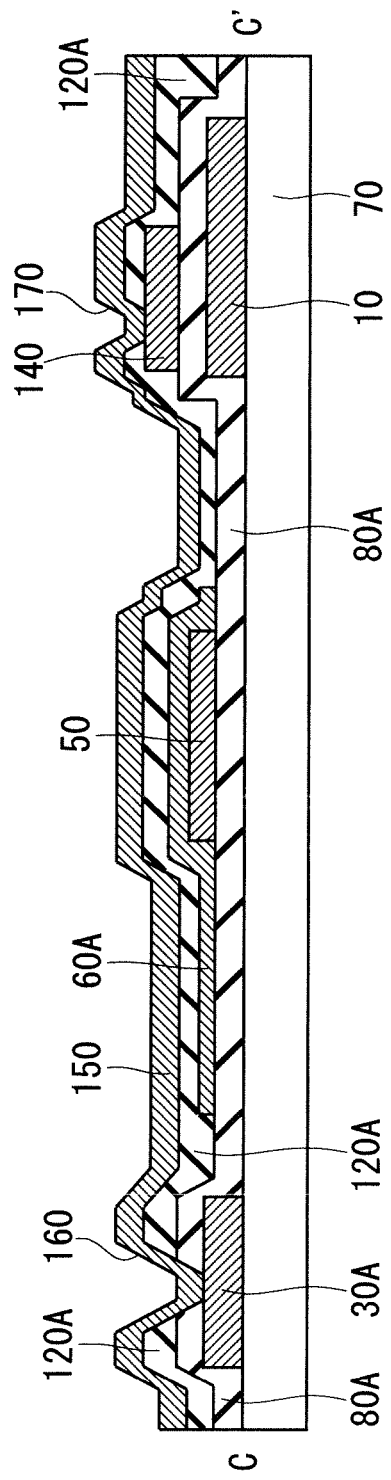
FIG. 5 is a cross-sectional view of the circuit configuration illustrated in FIG. 3, corresponding to the cross-section C-C'.

FIG. 3 is a schematically-illustrated plan view of a circuit configuration of the array substrate used for the display apparatus according to the present preferred embodiment. FIG. 4 is a cross-sectional view of the circuit configuration illustrated in FIG. 3, corresponding to the cross-section B-B'. FIG. 5 is a cross-sectional view of the circuit configuration illustrated in FIG. 3, corresponding to the cross-section C-C'.

The first preferred embodiment illustrates the array substrate having a TN structure. The display apparatus according to the present preferred embodiment is not limited to the TN structure. That is, for an array substrate having, for instance, an FFS structure (fringe-field-switching-mode display apparatus), a bright pixel defect is likewise repaired to be a dark pixel.

FIG. 3 illustrates a pixel electrode 60A provided with some cutout patterns 61. FIG. 3 also illustrates a common electrode 150 provided with some cutout patterns 151. FIGS. 4 and 5 each illustrate a portion corresponding to the cutout pattern 151 of the common electrode 150.

<Method for Producing Array Substrate for Display Apparatus>

The following describes a method for producing a display apparatus having the FFS structure, according to the present preferred embodiment.

The first step is forming a metal thin film on the upper surface of the transparent, insulating glass substrate 70 using a sputtering apparatus, as illustrated in FIGS. 4 and 5. As illustrated in FIGS. 3, 4 and 5, the metal thin film then undergoes a photolithography process, an etching process, and further a resist removal process so as to form the gate wire 10 and a common wire 30A.

The next step is forming, using a CVD apparatus, an insulating film 80A made of a material such as $SiO_2$ on the entire surface of the insulating glass substrate 70, as illustrated in FIGS. 4 and 5.

The following step is forming, using the sputtering apparatus, about −80 nm-thick InGaZnO, which is an oxide semiconductor, under a condition in which InGaZnO has a property of a semiconductor, on the entire surface of the insulating film 80A so as to form a semiconductor portion on the entire surface to thus form an inorganic film. Specifically, InGaZnO is formed to have an oxygen partial pressure of about 9% with respect to argon (Ar) in sputtering.

The following step is a photolithography step for keeping the semiconductor portion in which a TFT is formed so as to form a resist in a TFT portion.

The following step is a plasma process using a nitrogen monoxide ($N_2O$) gas ($N_2O$ plasma process) to convert InGaZnO from a semiconductor into an insulator so as to form an inorganic film (repair oxide-pattern 90) that includes an insulator portion in a resist-uncovered portion. The next step is removing the resist.

As illustrated in FIGS. 3, 4 and 5, the oxide semiconductor is formed in the TFT 40 necessary to form the display apparatus, and also constitutes a repair oxide-pattern 90A in a position spaced apart from the TFT 40.

The following step is forming a metal thin film using the sputtering apparatus, followed by forming the source wire 20 (see FIG. 3) and the drain electrode 50 (see FIGS. 3, 4 and 5) using the metal thin film.

At this time, as illustrated in FIGS. 3, 4 and 5, a part of the drain electrode 50 and a part of the repair oxide-pattern 90A, which is previously formed, are brought into direct contact with each other. Additionally, a common-electrode connection pattern 140 is formed that extends from another part of the repair oxide-pattern 90A, opposite to the part in contact with the drain electrode 50 (see FIGS. 3, 4 and 5).

The following step is directly forming the pixel electrode 60A on the upper surface of the insulating film 80A after the formation of the drain electrode 50. The pixel electrode 60A is formed to partly cover the drain electrode 50. The subsequent step is forming an insulating film 120A on the entire surface of the glass substrate 70, as illustrated in FIGS. 4 and 5.

The first preferred embodiment describes forming the contact hole 100 in the position in the insulating film 80, corresponding to the gate wire 10, and further forming the gate-wire connection pattern 110 to extend from where the contact hole 100 is formed. In contrast to this, there is no contact hole in a position in the insulating film 80A, corresponding to the gate wire 10 in the present preferred embodiment.

The following step is forming a contact hole 160 in a position in the insulating film 80A and insulating film 120A, corresponding to the common wire 30A. At the same time, a contact hole 170 is formed in a position in the insulating film 120A, corresponding to the common-electrode connection pattern 140 in contact with the repair oxide-pattern 90A.

The subsequent step is forming the common electrode 150 that includes a transparent electrode on the entire surface of a display region. The common electrode 150 is formed to cover the contact hole 160 and the contact hole 170. It is noted that the common electrode 150 is formed across the display region, except on the TFT 40 and on the repair oxide-pattern 90A (see FIG. 3).

<Method for Repair>

The following describes a method for repair according to the present preferred embodiment.

The repair oxide-pattern 90A is irradiated with ultraviolet rays using an ultraviolet laser. The ultraviolet rays are radiated from the glass substrate toward the inorganic film, i.e., from the back surface of the glass substrate 70 toward the repair oxide-pattern 90A. The ultraviolet rays pass through the glass substrate 70 to be radiated to the repair oxide-pattern 90A, which is the insulator portion of the insulating film and inorganic film.

Irradiating, with the ultraviolet rays, a portion in which the insulator portion that is an oxide semiconductor film converted into the insulator and the insulating film that is a silicon oxide ($SiO_2$) film are in direct contact with each other leads to a particularly effective excitation of electron carriers of the oxide semiconductor film to thus reduce the resistivity of the oxide semiconductor film. Consequently, the insulator portion is converted into a conductor to constitute a conductor portion.

The conductor portion, which is the oxide semiconductor converted into the conductor, is in direct contact with the drain electrode 50 that is the first conductive film and with the gate-wire connection pattern 140 that is a second conductive film. Thus, the drain electrode 50, which is the first conductive film, and the gate-wire connection pattern 140, which is the second conductive film, are electrically conducted through the oxide semiconductor film converted into the conductor.

As a result, repair of connection is enabled. Additionally, the drain electrode 50, which is the first conductive film, and the gate-wire connection pattern 140, which is the second conductive film, and the oxide semiconductor film converted into the conductor are in close, direct contact with each other. Such a configuration reduces faulty repairs when compared with a conventional configuration.

As illustrated in FIG. 3, the repair oxide-pattern 90A is connected to both drain electrode 50 and common electrode 150. In such positioning of the repair oxide-pattern 90A, the repair oxide-pattern 90A of an applicable pixel is irradiated with the ultraviolet rays when the repair for the dark pixel is needed. As a result, a common potential is supplied to the pixel electrode.

This enables the bright pixel defect to be forcedly converted into the dark pixel in a liquid crystal display apparatus having the FFS structure and having a characteristic of normally-black display.

Third Preferred Embodiment

The flowing describes an array substrate for a display apparatus, a display apparatus, a method for producing an array substrate for a display apparatus, and a method for producing a display apparatus, according to a third preferred embodiment. Like components described in the previous preferred embodiments are denoted by the same symbols, and a detailed description of the like components is omitted as necessary.

<Array Substrate for Display Apparatus>

As described in the previous preferred embodiments, the method for repair in each preferred embodiment enables the repair by the ultraviolet irradiation of the repair oxide-pattern.

Here, a structure near the repair oxide-pattern is reflected so that the ultraviolet irradiation is performed in a necessary region at a necessary stage.

In other words, a member, such as a metal thin film that blocks the ultraviolet rays or a black matrix (i.e., BM) resin of a color filter is preferably not disposed in at least one of the upper and lower surfaces of the repair oxide-pattern.

Figure 6:
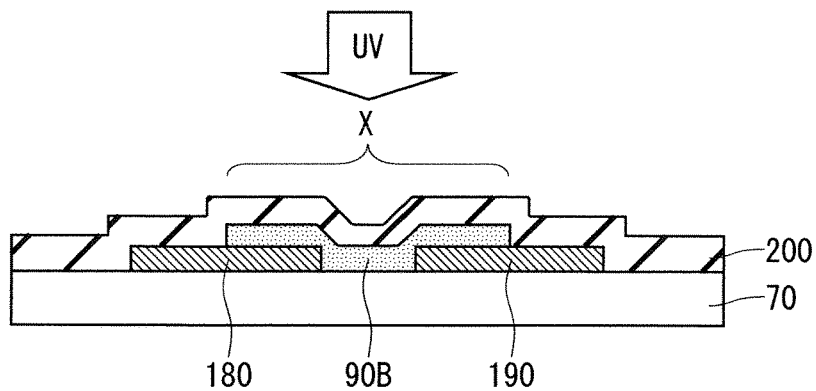
FIG. 6 is a schematically-illustrated cross-sectional view of a structure in which a light-shading pattern is not disposed above the upper surface of a repair oxide-pattern, irradiated with ultraviolet rays.
Figure 7:
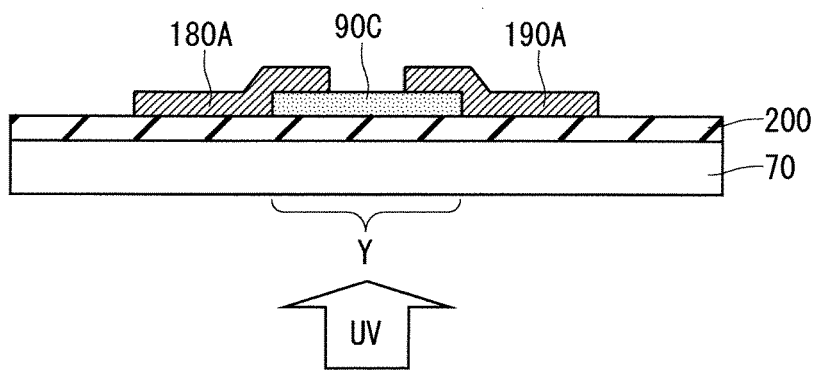
FIG. 7 is a schematically-illustrated cross-sectional view of a structure in which a light-shading pattern is not disposed below the lower surface of the repair oxide-pattern, irradiated with ultraviolet rays.

FIG. 6 is a schematically-illustrated cross-sectional view of a structure in which a light-shading pattern is not disposed above the upper surface of the repair oxide-pattern, irradiated with ultraviolet rays. In FIG. 6, an arrow denotes a direction in which the ultraviolet rays are radiated. FIG. 7 is a schematically-illustrated cross-sectional view of a structure in which a light-shading pattern is not disposed below the lower surface of the repair oxide-pattern, irradiated with ultraviolet rays. In FIG. 7, an arrow denotes a direction in which the ultraviolet rays are radiated.

A region including the repair oxide-pattern, provided for the repair is unnecessary in normal display. Hence, an increase in this region can reduce the aperture ratio, which is a key characteristic of the display apparatus.

To minimize the reduction in aperture ratio, the repair oxide-pattern is desirably disposed in a position in which the repair oxide-pattern overlaps the gate wire or the drain electrode, for instance.

For instance, as illustrated in FIG. 6, disposed on the upper surface of the transparent and insulating glass substrate 70 are a conductive film 180 and a conductive film 190. The conductive film 180 and the conductive film 190 are spaced apart from each other. Further, disposed on the upper surface of the glass substrate 70 is a repair oxide-pattern 90B.

Here, the repair oxide-pattern 90B partly overlaps the conductive film 180 in a plan view, and the repair oxide-pattern 90B is provided to cover the conductive film 180 in the overlap portion. Additionally, the repair oxide-pattern 90B partly overlaps the conductive film 190 in a plan view, and the repair oxide-pattern 90B is provided to cover the conductive film 190 in the overlap portion.

The repair oxide-pattern 90B extends between the conductive film 180 and the conductive film 190.

An insulating film 200 is then provided to cover the upper surface of the conductive film 180, the upper surface of the conductive film 190, and the upper surface of the repair oxide-pattern 90B. At this time, the insulating film 200 is at least partly disposed on the upper surface of the glass substrate 70.

In this case, the light-shading pattern that can shade the ultraviolet rays radiated from above the upper surface of the repair oxide-pattern 90B is not disposed above the upper surface (X region in FIG. 6).

When a bright pixel defect is detected, ultraviolet irradiation from the repair oxide-pattern 90B toward the glass substrate 70, i.e., ultraviolet irradiation in a direction of the arrow in FIG. 6 converts the repair oxide-pattern 90B into a conductor.

As illustrated in FIG. 7, the insulating film 200 is also disposed on the upper surface of the glass substrate 70, for instance. The insulating film 200 in its entirety is disposed on the upper surface of the glass substrate 70. Further, disposed on the upper surface of the insulating film 200 is a repair oxide-pattern 90C. Then, disposed on the upper surfaces of the insulating film 200 and repair oxide-pattern 90C are a conductive film 180A and a conductive film 190A.

Here, the repair oxide-pattern 90C partly overlaps the conductive film 180A in a plan view, and the conductive film 180A is provided to cover the upper surface of the repair oxide-pattern 90C in the overlap portion. Additionally, the repair oxide-pattern 90C partly overlaps the conductive film 190A in a plan view, and the conductive film 190A is provided to cover the upper surface of the repair oxide-pattern 90C in the overlap portion.

In this case, the light-shading pattern that can shade the ultraviolet rays from below the lower surface of the repair oxide-pattern 90C is not disposed below the lower surface (Y region in FIG. 7).

When the bright pixel defect is detected, ultraviolet irradiation from the glass substrate 70 toward the repair oxide-pattern 90C, i.e., ultraviolet irradiation in a direction of the arrow in FIG. 7 converts the repair oxide-pattern 90C into a conductor.

The conductive film 180A is connected to, for instance, the drain electrode 50 of the TFT 40 illustrated in the FIG. 1. The conductive film 190A is connected to, for instance, the gate wire 10 of the TFT 40 illustrated in FIG. 1.

The conductive film 180A is also connected to, for instance, the drain electrode 50 of the TFT 40 illustrated in FIG. 3. The conductive film 190A is also connected to, for instance, the common electrode 150 of the TFT 40 illustrated in FIG. 3.

Figure 8:
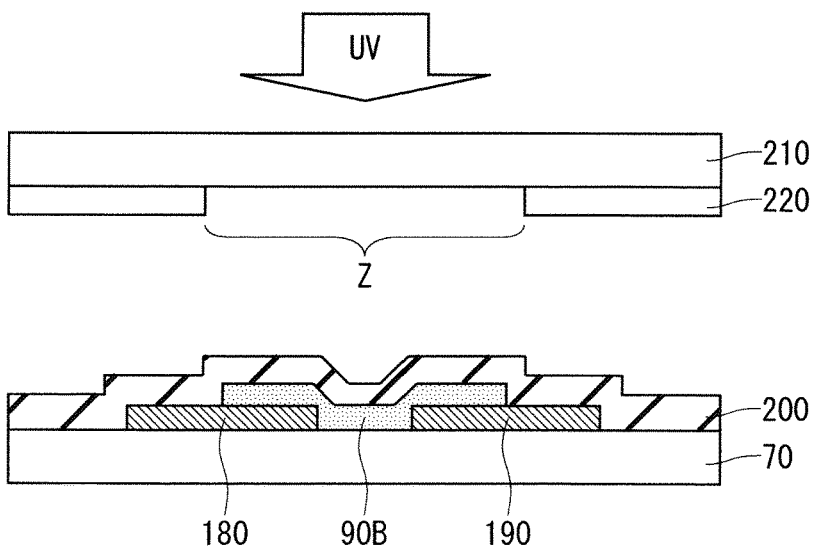
FIG. 8 is a schematically-illustrated cross-sectional view of a structure of a display apparatus in which a light-shading pattern is not disposed above the upper surface of the repair oxide-pattern, irradiated with ultraviolet rays.

FIG. 8 is a schematically-illustrated cross-sectional view of a structure of the display apparatus in which a light-shading pattern is not disposed above the upper surface of the repair oxide-pattern, irradiated with ultraviolet rays. In FIG. 8, an arrow denotes a direction in which the ultraviolet rays are radiated.

For instance, as illustrated in FIG. 8, the conductive film 180, the conductive film 190, and the repair oxide-pattern 90B are disposed on the upper surface of the glass substrate 70.

Here, the repair oxide-pattern 90B partly overlaps the conductive film 180 in a plan view, and the repair oxide-pattern 90B is provided to cover the conductive film 180 in the overlap portion. Additionally, the repair oxide-pattern 90B partly overlaps the conductive film 190 in a plan view, and the repair oxide-pattern 90B is provided to cover the conductive film 190 in the overlap portion.

The insulating film 200 is then provided to cover the conductive film 180, the conductive film 190, and the repair oxide-pattern 90B.

A black matrix 220 is moreover disposed above the upper surface the repair oxide-pattern 90B. Additionally, disposed on the upper surface of the black matrix 220 is a color filter substrate 210.

In this case, a light-shading pattern that can shade the ultraviolet rays from above the upper surface of the repair oxide-pattern 90B is not disposed on or above the upper surface (Z region in FIG. 8). In other words, the black matrix 220 is not disposed in the Z region corresponding to the repair oxide-pattern 90B in a plan view, either.

It is desirable that a color material film as well as the black matrix 220 be not disposed on or above the upper surface of the repair oxide-pattern 90B (Z region in FIG. 8).

Such positioning enables the repair by ultraviolet irradiation from the color filter substrate 20 or from above the color filter substrate 210. The repair for the dark pixel, which has been conventionally performed in limited steps (stages), is enabled in a step subsequent to the positioning of the color filter substrate 210. This enables the repair to be applied in a wide range.

Figure 9:
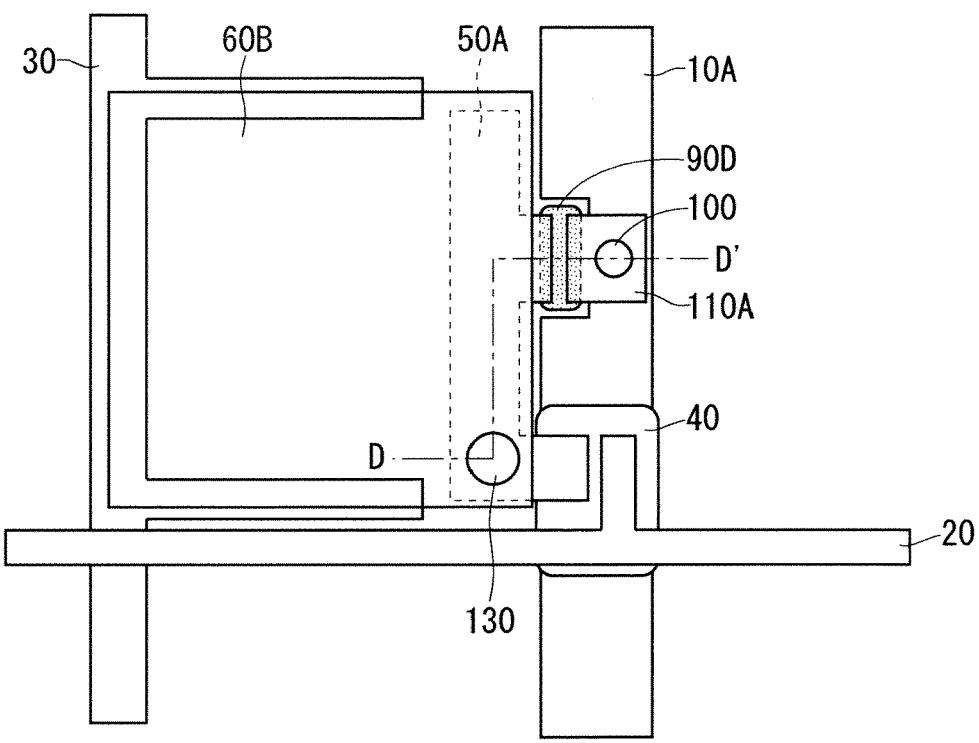
FIG. 9 is a schematically-illustrated plan view of a circuit configuration on an array substrate used for a display apparatus according to a preferred embodiment.
Figure 10:
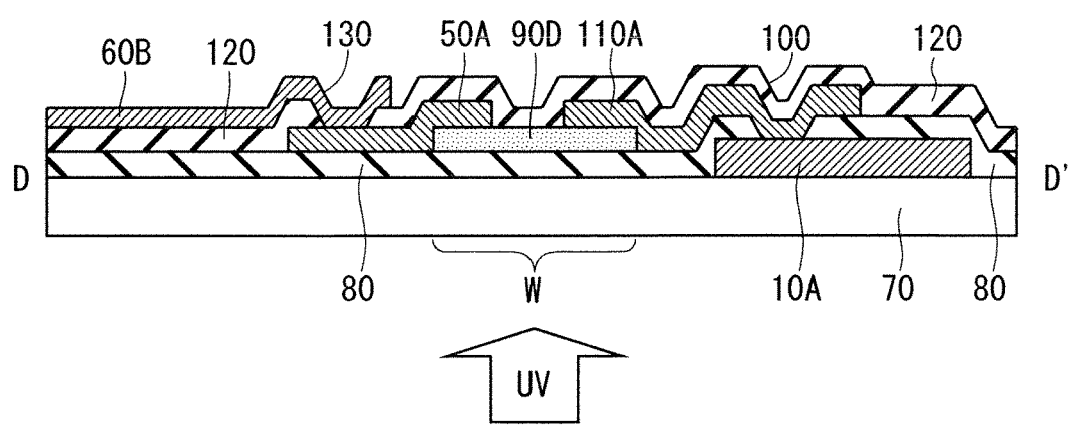
FIG. 10 is a cross-sectional view of the circuit configuration illustrated in FIG. 9, corresponding to the cross-section D-D'.

FIG. 9 is a schematically-illustrated plan view of a circuit configuration on the array substrate used for the display apparatus according to the present preferred embodiment. FIG. 10 is a cross-sectional view of the circuit configuration illustrated in FIG. 9, corresponding to the cross-section D-D'. In FIG. 10, an arrow denotes a direction in which ultraviolet rays are radiated.

As illustrated in FIG. 9, the display apparatus includes a display region provided with a plurality of gate wires 10A and the plurality of source wires 20. The plurality of gate wires 10A each extend in an X-direction, and disposed in a Y-direction. The plurality of source wires 20 each extend in the Y-direction while intersecting with the gate wire 10A and is disposed in the X-direction.

The display region of the display apparatus also includes the plurality of common wires 30 each spaced apart from the gate wire 10A at a regular interval. The common wires 30 are electrically connected to each other.

The display region of the display apparatus also includes the TFTs 40, which are semiconductor switching elements, at intersections of the gate wires 10A and source wires 20. The TFTs 40 are each connected to the gate wire 10A, the source wire 20, and the drain electrode 50A.

The drain electrodes 50 of the TFTs 40 are connected to pixel electrodes 60B. Additionally, the pixel electrodes 60B are each connected to the common wire 30 via a holding capacity.

All the intersections of the plurality of gate wires 10A and plurality of source wires 20 have a matrix of the circuit configuration illustrated in FIG. 9. That is, FIG. 9 illustrates the circuit configuration at one of these intersections.

The gate wire 10A (see FIGS. 9 and 10) and the common wire 30 (see FIG. 9) are disposed on the upper surface of the transparent and insulating glass substrate 70.

As illustrated in FIG. 10, the insulating film 80 made of a material such as $SiO_2$, is disposed on the entire surface of the insulating glass substrate 70. Additionally, an oxide semiconductor made of a material such as InGaZnO is disposed on the insulating film 80.

In the present preferred embodiment, as illustrated in FIG. 9, not only the TFT 40 necessary to constitute the display apparatus, but also a repair oxide-pattern 90D is disposed in a position spaced apart from the TFT 40.

The source wire 20 (see FIG. 9) and the drain electrode 50A (see FIGS. 9 and 10) are disposed on the upper surface of the insulating film 80.

At this time, as illustrated in FIGS. 9 and 10, a part of the drain electrode 50A and a part of repair oxide-pattern 90D are in direct contact with each other. Additionally, the contact hole 100 is disposed in a position in the insulating film 80, corresponding to the gate wire 10A of the insulating film 80 so that the repair oxide-pattern 90D and the gate wire 10A are connected to each other (see FIGS. 9 and 10). Additionally, a gate-wire connection pattern 110A is provided to extend from the contact hole 100 to the repair oxide-pattern 90D. The gate-wire connection pattern 110A is in direct contact with a part of the repair oxide-pattern 90D (see FIGS. 9 and 10).

As illustrated in FIG. 10, the insulating film 120 is disposed on the entire surface of the substrate. Then, the contact hole 130 is disposed in a position in the insulating film 120, corresponding to the drain electrode 50A. Then, the pixel electrode 60B including an ITO, which is a transparent electrode, is provided to extend from the contact hole 130 (see FIGS. 9 and 10).

As illustrated in FIGS. 9 and 10, the display apparatus according to the present preferred embodiment is configured such that the contact hole 100 is disposed in the insulating film 80, above the gate wire 10A, and that a potential of the gate wire 10A is supplied to the gate-wire connection pattern 110A, which is in an upper layer. The display apparatus is also configured such that the gate-wire connection pattern 110A and the drain electrode 50A are not in direct contact with each other and are adjacent to each other.

The display apparatus is further configured such that the insulating repair oxide-pattern 90D, which includes the oxide semiconductor, is disposed in a position in which the insulating repair oxide-pattern 90D is in contact with both gate-wire connection pattern 110A and drain electrode 50A.

As illustrated in FIG. 9, the display apparatus is also configured such that the repair oxide-pattern 90D is disposed in a recess of the gate wire 10A. Accordingly, the repair oxide-pattern 90D is surrounded by the gate wire 10A in a plan view.

Such positioning of the repair oxide-pattern 90D reduces a gap between the pixel electrode 60B and the gate wire 10A in a plan view. This enables a rise in aperture ratio.

The structure illustrated in FIG. 10 is configured such that the repair oxide-pattern 90D is provided not to overlap the gate wire 10A in a plan view. The structure illustrated in FIG. 10 is also configured such that the repair oxide-pattern 90D includes a region that does not overlap the drain electrode 50A and gate-wire connection pattern 110A in a plan view.

The structure illustrated in FIG. 10 is configured such that no other metal thin film pattern that obstacles light exists on or above the upper surface of the repair oxide-pattern 90D, or on or below the lower surface of the repair oxide-pattern 90D. That is, the structure illustrated in FIG. 10 is configured such that the region, which does not overlap the drain electrode 50A of the repair oxide-pattern 90D and the gate-wire connection pattern 110A in a plan view, does not overlap the other metal thin film pattern in a plan view, either.

Such a structure enables the repair not only after the production of the array substrate, but also at a subsequent stage.

For instance, checking for lighting-up is performed when the array substrate has been processed into cells. If a bright pixel defect is detected at this stage, the repair would be still performed in the array substrate as processed into the cells by, for instance, the ultraviolet irradiation from the lower surface of the glass substrate 70 or from below the lower surface of the glass substrate 70 as illustrated in FIG. 7.

Fourth Preferred Embodiment

The following describes an array substrate for a display apparatus, a display apparatus, a method for producing an array substrate for a display apparatus, and a method for producing a display apparatus, according to a fourth preferred embodiment. Like components described in the previous preferred embodiments are denoted by the same symbols, and a detailed description of the like components is omitted as necessary.

<Array Substrate for Display Apparatus>

The previous preferred embodiments describe the repair for the dark pixel using potentials of different electrodes within the array substrate. Meanwhile, in view of a structure of a display apparatus that has been processed into a panel, a method for repair is applicable in which, for instance, a potential in a color filter is supplied to the array substrate.

FIG. 11 is a schematically-illustrated cross-sectional view of a structure of a display apparatus according to the present preferred embodiment. FIG. 12 is a schematically-illustrated cross-sectional view of another structure of the display apparatus according to the present preferred embodiment.

In FIG. 11, the insulating film 200 is disposed on the upper surface of the glass substrate 70. Additionally, the conductive film 180A, the conductive film 190A, and the repair oxide-pattern 90C are disposed on the upper surface of the insulating film 200.

Here, the repair oxide-pattern 90C partly overlaps the conductive film 180A in a plan view, and the conductive film 180A is provided to cover the repair oxide-pattern 90C in the overlap portion. Additionally, the repair oxide-pattern 90C partly overlaps the conductive film 190A in a plan view, and the conductive film 190A is provided to cover the repair oxide-pattern 90C in the overlap portion.

An electrode 230 in the color filter is moreover disposed on or above the upper surface of the repair oxide-pattern 90C. Additionally, the color filter substrate 210 is disposed on the upper surface of the electrode 230 in the color filter.

A conductive spacer 240A is then provided to be in contact with both electrode 230 in the color filter and conductive film 180A.

The conductive film 190A is connected to a pixel electrode, which is not shown herein.

In such a structure, ultraviolet irradiation of the repair oxide-pattern 90C enables the potential of the electrode 230 in the color filter to be supplied to the conductive film 180A, which is, for instance, a drain electrode, via the conductive spacer 240A. This achieves a method for repair in which the potential in the color filter is supplied to the array substrate.

In FIG. 12, the conductive film 180, the conductive film 190, and the repair oxide-pattern 90B are disposed on the upper surface of the glass substrate 70.

Here, the repair oxide-pattern 90B partly overlaps the conductive film 180 in a plan view, and the repair oxide-pattern 90B is provided to cover the conductive film 180 in the overlap portion. Additionally, the repair oxide-pattern 90B partly overlaps the conductive film 190 in a plan view, and the repair oxide-pattern 90B is provided to cover the conductive film 190 in the overlap portion.

The insulating film 200 is then provided to cover the conductive film 180, the conductive film 190, and the repair oxide-pattern 90B.

The electrode 230 in the color filter is moreover disposed above the upper surface of the repair oxide-pattern 90B. Additionally, the color filter substrate 210 is disposed on the upper surface of the electrode 230 in the color filter.

A conductive spacer 240B is then provided to be in contact with the electrode 230 in the color filter and the conductive film 180. It is noted that the insulating film 200 is not disposed in a portion in which the conductive film 180 and the conductive spacer 240B are in contact with each other.

The conductive film 190 is connected to a pixel electrode, which is not shown herein.

In such a structure, ultraviolet irradiation of the repair oxide-pattern 90B enables the potential of the electrode 230 in the color filter to be supplied to the conductive film 180, which is, for instance, the drain electrode, via the conductive spacer 240B. This achieves the method for repair in which the potential in the color filter is supplied to the array substrate.

Fifth Preferred Embodiment

The following describes an array substrate for a display apparatus, a display apparatus, a method for producing an array substrate for a display apparatus, and a method for producing a display apparatus, according to a fifth preferred embodiment. Like components described in the previous preferred embodiments are denoted by the same symbols, and a detailed description of the like components is omitted as necessary.

The previous preferred embodiments illustrate the production method that includes forming the oxide semiconductor before forming the electrode. The method may include forming the electrode before forming the oxide semiconductor.

FIG. 13 is a schematically-illustrated cross-sectional view of a structure of the display apparatus according to the present preferred embodiment.

The structure illustrated in FIG. 13 is configured such that the conductive film 180, the conductive film 190, and the repair oxide-pattern 90B are disposed on the upper surface of the glass substrate 70.

Here, the repair oxide-pattern 90B partly overlaps the conductive film 180 in a plan view, and the repair oxide-pattern 90B is provided to cover the conductive film 180, which is previously provided, in the overlap portion. Additionally, the repair oxide-pattern 90B partly overlaps the conductive film 190 in a plan view, and the repair oxide-pattern 90B is provided to cover the conductive film 190, which is previously provided, in the overlap portion.

The insulating film 200 made of a material such as $SiO_2$ is then provided to cover the conductive film 180, the conductive film 190, and the repair oxide-pattern 90B.

Effects of Aforementioned Preferred Embodiments

The following illustrates effects of the aforementioned preferred embodiments. Although these effects are based on the specific configurations illustrated in the aforementioned preferred embodiments, these configurations may be replaced with other specific configurations illustrated in the present specification to such an extent that the same effects are achieved.

The replacements may be done over the preferred embodiments. That is, combinations of the individual configurations, which are illustrated in the different preferred embodiments, may bring the same effects.

According to the aforementioned preferred embodiments, the array substrate for a display apparatus includes: the insulating glass substrate 70, which is transparent; the insulating film 200 (insulating film 80) at least partly disposed on the upper surface of the glass substrate 70 and containing silicon oxide or metal oxide as a main component; the first conductive film; the second conductive film; and the insulator portion formed by converting the oxide semiconductor film into the insulator. Here, the conductive film 180 corresponds to the first conductive film. The conductive film 190 corresponds to the second conductive film. The repair oxide-pattern 90B corresponds to the insulator portion. The conductive film 190 is spaced apart from the conductive film 180. The repair oxide-pattern 90B is in direct contact with the conductive film 180 and the conductive film 190. The repair oxide-pattern 90B also extends between the conductive film 180 and the conductive film 190. The repair oxide-pattern 90B is also converted into the insulator. The insulating film 200 is at least partly disposed on the upper surface of the glass substrate 70. The upper surface or lower surface of the repair oxide-pattern 90B is also in direct contact with the insulating film 200.

In such a configuration, the ultraviolet irradiation of the oxide semiconductor film as converted into the insulator brings the one conductive film and the other conductive film each in direct contact with the oxide semiconductor film into conduction. Consequently, the gate potential applied to the other conductive film, for instance, is supplied to the one conductive film and further to, for instance, the pixel electrode connected to the one conductive film, via the oxide semiconductor film. Since the gate electrode is supplied to the pixel electrode, the repair for the dark pixel is enabled. An apparatus including a laser is not used, to thus minimize metal patterns in a location irradiated with a laser beam to have different shapes from each other or to peel, due to laser irradiation. This improves the quality and yield of the array substrate for a display apparatus. This also eliminates the need for positioning of an array pattern to reflect the overlap portion of the gate wire and pixel electrode, which is needed for repairing using the laser.

Different configurations illustrated in the present specification, other than the above configurations may be omitted as necessary. That is, the above configurations alone bring the above-described effects.

However, the above configurations can additionally include at least one of the different configurations illustrated in the present specification as necessary; that is, the above configurations can additionally include the different configurations illustrated in the present specification, which are excluded from these configurations. Such additionally-included configurations still bring the above-described effects.

According to the aforementioned preferred embodiments, the insulating film 200 in its entirety is disposed on the upper surface of the glass substrate 70. Additionally, the first conductive film and the second conductive film are in direct contact with the upper surface of the oxide semiconductor film. Here, the conductive film 180A corresponds to the first conductive film. The conductive film 190A corresponds to the second conductive film. The repair oxide-pattern 90C corresponds to the oxide semiconductor film. Such a configuration enables the repair oxide-pattern 90C to efficiently receive the ultraviolet rays radiated from below, i.e., from a position adjacent to a surface of the repair oxide-pattern 90C in contact with the insulating film 200. This promotes the conversion of the repair oxide-pattern 90C into the conductor.

According to the aforementioned preferred embodiments, a structure shading the ultraviolet rays is not disposed below a position in the insulating film 200, corresponding to the repair oxide-pattern 90C. Such a configuration enables the repair for the dark pixel by the ultraviolet irradiation from below the insulating film 200.

According to the aforementioned preferred embodiments, the insulating film 200 is disposed between the upper surface of the glass substrate 70 and the upper surface of the repair oxide-pattern 90B. Additionally, the repair oxide-pattern 90B is in direct contact with the upper surface of the conductive film 180 and the upper surface of the conductive film 190. Such a configuration enables the repair oxide-pattern 90B to efficiently receive the ultraviolet rays radiated from above, i.e., from a position adjacent to a surface of the repair oxide-pattern 90B in contact with the insulating film 200. This promotes the conversion of the repair oxide-pattern 90B into the conductor.

According to the aforementioned preferred embodiments, a structure shading the ultraviolet rays is not disposed above a position in the insulating film 200, corresponding to the repair oxide-pattern 90B. Such a configuration enables the repair for the dark pixel by the ultraviolet irradiation from above the insulating film 200.

According to the aforementioned preferred embodiments, the array substrate for a display apparatus includes the color filter substrate 210, the electrode 230, the conductive spacer 240A, and the pixel electrode. Here, the color filter substrate 210 is disposed above the glass substrate 70. The electrode 230 is disposed on the lower surface of the color filter substrate 210. The conductive spacer 240A is connected to the electrode 230 and the conductive film 180A. Additionally, the pixel electrode is connected to the conductive film 190A. In such a configuration, the ultraviolet irradiation of the repair oxide-pattern 90C enables the potential of the electrode 230 in the color filter substrate 210 to be supplied to the conductive film 180A, which is, for instance, the drain electrode, via the conductive spacer 240A. This achieves the method for repair in which the potential in the color filter substrate 210 is supplied to the array substrate.

According to the aforementioned preferred embodiments, the repair oxide-pattern 90 has a characteristic of being converted into the conductor by the ultraviolet irradiation. In such a configuration, the repair oxide-pattern 90 of the applicable pixel detected to be abnormal is irradiated with the ultraviolet rays. This converts the repair oxide-pattern 90 in a region that undergoes irradiation with the ultraviolet rays into the conductor. This brings the conductive films each in contact with the repair oxide-pattern 90, into conduction. As a result of this conduction, a gate potential applied to the one conductive film, for instance, is supplied to the other conductive film and further to, for instance, the pixel electrode connected to the other conductive film, via the repair oxide-pattern 90 having high conductivity. Since the gate potential is supplied to the pixel electrode, the liquid crystal display apparatus having the characteristic of normally-white display, for instance, is configured such that the applicable pixel is forcedly displayed as the constantly-dark pixel. This enables the repair of the bright pixel defect to be the dark pixel defect.

According to the aforementioned preferred embodiments, the array substrate for a display apparatus includes a transistor. Here, the TFT 40 is the transistor. Additionally, the conductive film 180A is connected to the drain electrode 50 of the TFT 40. Additionally, the conductive film 190A is connected to the gate wire 10 of the TFT 40. In such a configuration, irradiating the repair oxide-pattern 90 of the applicable pixel detected to be abnormal with the ultraviolet rays raises the conductivity of the insulating oxide semiconductor in the area that undergoes the ultraviolet irradiation. In other words, the repair oxide-pattern 90 is converted into the conductor in this region. Consequently, the gate-wire connection pattern 110 and the drain electrode 50, each connected to the repair oxide-pattern 90, are brought into conduction. As a result of this conduction, the gate potential applied to the gate-wire connection pattern 110 is supplied to the drain electrode 50 and further to the pixel electrode 60 connected to the drain electrode 50, via the repair oxide-pattern 90 having high conductivity. Since the gate potential is supplied to the pixel electrode 60, the liquid crystal display apparatus having the characteristic of normally-white display, for instance, is configured such that the applicable pixel is forcedly displayed as the constantly-dark pixel. This enables the repair of the bright pixel defect to be the dark pixel defect.

According to the aforementioned preferred embodiments, the array substrate for a display apparatus has the FFS structure and includes the TFT 40. Additionally, the conductive film 180A is connected to the drain electrode 50 of the TFT 40. Additionally, the conductive film 190A is connected to the common electrode 150 of the TFT 40. In such a configuration, the repair oxide-pattern 90A of the applicable pixel is irradiated with the ultraviolet rays when the repair for the dark pixel is needed. As a result, the common potential is supplied to the pixel electrode. This achieves the repair of the bright pixel defect to be forcedly the dark pixel in the liquid crystal display apparatus having the FFS structure and having the characteristic of normally-black display.

According to the aforementioned preferred embodiments, the display apparatus includes the aforementioned array substrate for a display apparatus. In such a configuration, the ultraviolet irradiation of the repair oxide-pattern corresponding to a pixel detected to be the bright pixel defect would still enable the repair for the dark pixel if, for instance, the array substrate has been processed into the cells.

According to the aforementioned preferred embodiments, the display apparatus includes the color filter substrate 210 and the black matrix 220. Here, the color filter substrate 210 is disposed above the glass substrate 70. Additionally, the black matrix 220 is disposed on the lower surface of the color filter substrate 210. Additionally, the black matrix 220 is not disposed above the position in the insulating film 200, corresponding to the repair oxide-pattern 90B in a plan view. In such a configuration, the ultraviolet irradiation from above the insulating film 200 enables the repair for the dark pixel.

According to the aforementioned preferred embodiments, a method for an array substrate for a display apparatus includes forming the glass substrate 70, which is transparent. The method also includes forming at least a part of the insulating film 200 containing silicon oxide or metal oxide as a main component, on the upper surface of the glass substrate 70. The method also includes forming the conductive film 180. The method also includes forming the conductive film 190 in a position spaced apart from the conductive film 180. The method also includes forming the repair oxide-pattern 90B as insulated that is in direct contact with the conductive film 180 and the conductive film 190 so as to extend to the conductive film 180 and the conductive film 190. The repair oxide-pattern 90B is formed to have an upper surface or lower surface in contact with the insulating film 200.

In such a configuration, the ultraviolet irradiation of the oxide semiconductor film as converted into the insulator brings the one conductive film and the other conductive film each in direct contact with the oxide semiconductor film into conduction. Consequently, the gate potential applied to the other conductive film, for instance, is supplied to the one conductive film and further to, for instance, the pixel electrode connected to the one conductive film, via the oxide semiconductor film. Since the gate electrode is supplied to the pixel electrode, the repair for the dark pixel is enabled. The apparatus including the laser is not used, to thus minimize the metal patterns in the location irradiated with the laser beam to have different shapes from each other or to peel, due to the laser irradiation. This improves the quality and yield of the array substrate for a display apparatus. This also eliminates the need for positioning of the array pattern to reflect the overlap portion of the gate wire and pixel electrode, which is needed for repairing using the laser.

Different configurations illustrated in the present specification, other than the above configurations may be omitted as necessary. That is, the above configurations alone bring the above-described effects.

However, the above configurations can additionally include at least one of the different configurations illustrated in the present specification as necessary; that is, the above configurations can additionally include the different configurations illustrated in the present specification, which are excluded from these configurations. Such additionally-included configurations still bring the above-described effects.

The order of the individual process steps can be changed unless otherwise specifically limited.

According to the aforementioned preferred embodiments, the method for producing the array substrate for a display apparatus includes forming the insulating film 200 before forming the repair oxide-pattern 90C. The method also includes, after the formation of the repair oxide-pattern 90C, forming the conductive film 180A and the conductive film 190A. Such a configuration enables the repair oxide-pattern 90C to efficiently receive the ultraviolet rays radiated from below, i.e., from the position adjacent to the surface of the repair oxide-pattern 90C in contact with the insulating film 200. This promotes the conversion of the repair oxide-pattern 90C into the conductor.

According to the aforementioned preferred embodiments, the method for producing an array substrate for a display apparatus includes forming the conductive film 180 and the conductive film 190 before forming the repair oxide-pattern 90B. The method also includes forming the insulating film 200 after the formation of the repair oxide-pattern 90B. Such a configuration enables the repair oxide-pattern 90B to efficiently receive the ultraviolet rays radiated from above, i.e., the position adjacent to the surface of the repair oxide-pattern 90B in contact with the insulating film 200. This promotes the conversion of the repair oxide-pattern 90B into the conductor.

According to the aforementioned preferred embodiments, the method for producing an array substrate for a display apparatus includes forming a film that includes the oxide semiconductor, followed by converting at least a part of the film that includes the oxide semiconductor so as to form the repair oxide-pattern 90B as insulated that is in direct contact with the insulating film 200. Such a configuration enables the film that includes the oxide semiconductor to be differently used in conformance with intended use, such as using at least a part of the film as formed that includes the oxide semiconductor as the repair oxide-pattern 90B.

According to the aforementioned preferred embodiments, the method for producing an array substrate for a display apparatus includes forming a film that includes the oxide semiconductor, followed by converting only a part of the film that includes the oxide semiconductor into the insulator so as to form the repair oxide-pattern 90B as insulated that is in direct contact with the insulating film 200. Such a configuration enables a part of the film as formed that includes the oxide semiconductor to be used as the repair oxide-pattern 90B, and enables the other part to be used as the TFT 40 for instance.

According to the aforementioned preferred embodiments, the method for producing an array substrate for a display apparatus includes irradiating the repair oxide-pattern 90 with the ultraviolet rays to convert the repair oxide-pattern 90 into the conductor. In such a configuration, the repair oxide-pattern 90 of the applicable pixel detected to be abnormal is irradiated with the ultraviolet rays. This converts the repair oxide-pattern 90 in the region that undergoes the irradiation with the ultraviolet rays into the conductor. This brings the one conductive film and the other conductive film, each connected to the repair oxide-pattern 90, into conduction. As a result of this conduction, a potential applied to the other conductive film is supplied to the one conductive film via the repair oxide-pattern 90 having high conductivity. Accordingly, the gate electrode is supplied to the pixel electrode, for instance, and thus the liquid crystal display apparatus having the characteristic of normally-white display is configured such that the applicable pixel is forcedly displayed as the constantly-dark pixel. This achieves the repair of the bright pixel defect to be the dark pixel defect.

According to the aforementioned preferred embodiments, the method for producing an array substrate for a display apparatus includes irradiating the insulating film and the repair oxide-pattern 90 with the ultraviolet rays so as to convert the repair oxide-pattern 90 into the conductor. Such a configuration would enable the repair oxide-pattern 90 to be properly converted into the conductor if the insulating film and the repair oxide-pattern 90 are irradiated with the ultraviolet rays.

According to the aforementioned preferred embodiments, the method for producing an array substrate for a display apparatus includes irradiating the repair oxide-pattern 90B with the ultraviolet rays in a direction from the repair oxide-pattern 90B toward the glass substrate 70 so as to convert the repair oxide-pattern 90B into the conductor. In such a configuration, the ultraviolet irradiation from the upper surface of the glass substrate 70 enables the repair for the dark pixel.

According to the aforementioned preferred embodiments, the method for producing an array substrate for a display apparatus is configured such that the glass substrate 70 includes a material that transmits ultraviolet rays. The method includes irradiating the repair oxide-pattern 90C with the ultraviolet rays in a direction from the glass substrate 70 toward the repair oxide-pattern 90C so as to convert the repair oxide-pattern 90C into the conductor. In such a configuration, the ultraviolet irradiation from the lower surface of the glass substrate 70 enables the repair for the dark pixel.

According to the aforementioned preferred embodiments, the method for producing an array substrate for a display apparatus includes forming the TFT 40. The method also includes forming the drain electrode 50 of the TFT 40, connected to the conductive film 180A. The method also includes forming the gate wire 10 of the TFT 40, connected to the conductive film 190A. In such a configuration, the repair oxide-pattern 90 of the applicable pixel detected to be abnormal is irradiated with the ultraviolet rays. This converts the repair oxide-pattern 90 in the region that undergoes the irradiation with the ultraviolet rays into the conductor. This brings the gate-wire connection pattern 110 and the drain electrode 50, each in contact with the repair oxide-pattern 90, into conduction. As a result of this conduction, the gate potential applied to the gate-wire connection pattern 110 is supplied to the drain electrode 50 and further to the pixel electrode 60 connected to the drain electrode 50, via the repair oxide-pattern 90 having high conductivity. Since the gate potential is supplied to the pixel electrode 60, the liquid crystal display apparatus having the characteristic of normally-white display, for instance, is configured such that the applicable pixel is forcedly displayed as the constantly-dark pixel. This achieves the repair of the bright pixel defect to be the dark pixel defect.

According to the aforementioned preferred embodiments, the method for producing an array substrate for a display apparatus includes forming the TFT 40. The method also includes forming the drain electrode 50 of the TFT 40, connected to the conductive film 180A. The method also includes forming the common electrode 150 of the TFT 40, connected to the conductive film 190A. In such a configuration, the repair oxide-pattern 90A of the applicable pixel is irradiated with the ultraviolet rays when the repair for the dark pixel is needed. As a result, the common potential is supplied to the pixel electrode. This enables the bright pixel defect to be forcedly the dark pixel in the liquid crystal display apparatus having the FFS structure and having the characteristic of normally-black display.

According to the aforementioned preferred embodiments, the method for producing an array substrate for a display apparatus includes forming the pixel electrode connected to the conductive film 190A. The method also includes forming the conductive spacer 240A connected to the conductive film 180A. In such a configuration, irradiating the repair oxide-pattern 90C with the ultraviolet rays enables the potential of the electrode 230 in the color filter to be supplied to the conductive film 180A, which is, for instance, the drain electrode, via the conductive spacer 240A. This achieves the method for repair in which the potential in the color filter substrate 210 is supplied to the array substrate.

According to the aforementioned preferred embodiments, the method for producing an array substrate for a display apparatus includes irradiating the repair oxide-pattern 90B with the ultraviolet rays from the ultraviolet lamp, an ultraviolet LED, or the ultraviolet laser so as to convert the repair oxide-pattern 90B into the conductor. Such a configuration enables the repair oxide-pattern 90B, which has the insulating property, to be irradiated with the ultraviolet rays from the ultraviolet lamp, the ultraviolet LED, or the ultraviolet laser so as to convert the repair oxide-pattern 90B into the conductor.

According to the aforementioned preferred embodiments, a method for producing a display apparatus includes the method for producing an array substrate for a display apparatus. In such a configuration, the ultraviolet irradiation of the repair oxide-pattern corresponding to the pixel detected to have the bright pixel defect would enable the repair for the dark pixel if, for instance, the array substrate has been processed into the cells.

Modifications of Aforementioned Preferred Embodiments

The aforementioned preferred embodiments illustrate that the TFT 40 includes the oxide semiconductor. In some embodiments, the TFT 40 is made of amorphous silicon. In this case, the TFT 40 is formed in a different step than the step of forming the repair oxide-pattern 90. In this case, for the repair oxide-pattern 90, for instance, about 80 nm thick InGaZnO, which is the oxide semiconductor, is formed on the entire surface of the insulating film using a sputtering apparatus, under a condition in which InGaZnO has a property of an insulator so as to form the inorganic film that contains the insulator portion. Specifically, InGaZnO is formed to have an oxygen partial pressure of about 20% with respect to argon (Ar) in sputtering, for instance.

In view of an efficient array-production process, forming the repair oxide-pattern is preferably at the same time as forming the semiconductor on the TFT. However, the repair oxide-pattern can be formed independently.

The process has one more step because of the dedicated step of forming the repair oxide-pattern. In such process, however, a repair oxide-pattern that has conductivity different from the semiconductor of the TFT, for instance, a repair oxide-pattern that has a characteristic closer to an insulator can be formed.

In the aforementioned preferred embodiments, the example of a material of the oxide semiconductor is InGaZnO. In some embodiments, the oxide semiconductor contains InZnO, InGaO, InSnO, InSnZnO, InGaZnSnO, InAlZnO, InHfZnO, InZrZnO, InMgZnO, or InYZnO. In such a configuration, the repair oxide-pattern has an insulating property under a predetermined forming condition. Additionally, the repair oxide-pattern is converted into the conductor by the ultraviolet irradiation.

In the aforementioned preferred embodiments, the example of a material of the insulator, which is in contact with the repair oxide-pattern, is $SiO_2$. In some embodiments, the insulator is made of a metal oxide material, such as aluminum oxide or titanium oxide. In this case, similar effects are achieved.

The material quality, material, size, and shape of each component, the positions of components relative to each other, and conditions for implementation, described in each of the aforementioned preferred embodiments are illustrative in all aspects. Thus, they are not limited to what are described in the present invention.

Thus, numerous variations not shown can be assumed within the range of the technique disclosed in the present specification. Examples of the variations include modification, addition and omission of at least one component. An additional example is extracting at least one component from at least one of the preferred embodiments so as to combine the extracted component with another component of a different preferred embodiment.

Unless otherwise contradicted, "one" component described in each of the preferred embodiments may include "one or more" components.

Individual components are conceptual units. One component may include multiple structures, one component may correspond to a part of some structure, and multiple components may be included in one structure.

Each component includes a structure of a different configuration or a different shape as long as the structure of the different configuration or the different shape achieves the same function.

The descriptions in the present specification are referred for any purposes regarding the present technique. It is thus not an admission that any of the descriptions provided herein are conventional techniques.

If the aforementioned preferred embodiments contain descriptions about materials without being particularly specified, it is to be understood that an example of these materials is an alloy containing other additives in these materials unless otherwise contradicted.

While the invention has been shown and described in detail, the foregoing description is in all aspects illustrative and not restrictive. It is therefore understood that numerous modifications and variations can be devised without departing from the scope of the invention.

What is claimed is:
1. An array substrate for a display apparatus, comprising:
an insulating substrate that is transparent;
an insulating film at least partly disposed on an upper surface of said insulating substrate and containing silicon oxide or metal oxide as a main component;
a first conductive film;
a second conductive film spaced apart from said first conductive film; and
an insulator portion that is in direct contact with and extends between said first conductive film and said second conductive film, said insulator portion being formed by converting an oxide semiconductor film into an insulator, wherein said insulator portion includes an upper surface or a lower surface in direct contact with said insulating film, and wherein a structure shading an ultraviolet ray is not disposed both above and below any position in said insulating film that corresponds to said insulator portion in a plan view.

2. The array substrate for a display apparatus according to claim 1, wherein said insulating film in its entirety is disposed on said upper surface of said insulating substrate, and wherein said first conductive film and said second conductive film are in direct contact with said upper surface of said insulator portion.

3. The array substrate for a display apparatus according to claim 2, wherein a structure shading an ultraviolet ray is not disposed below a position in said insulating film that corresponds to said insulator portion.

4. The array substrate for a display apparatus according to claim 1, wherein said insulating film is in direct contact with said upper surface of said insulating substrate and said upper surface of said insulator portion, and wherein said insulator portion is in direct contact with an upper surface of said first conductive film and an upper surface of said second conductive film.

5. The array substrate for a display apparatus according to claim 4, wherein a structure shading an ultraviolet ray is not disposed above a position in said insulating film that corresponds to said insulator portion.

6. The array substrate for a display apparatus according to claim 1, further comprising:
    a color filter substrate disposed above said insulating substrate;
    an electrode disposed on a lower surface of said color filter substrate;
    a conductive spacer connected to said electrode and said first conductive film; and
    a pixel electrode connected to said second conductive film.

7. The array substrate for a display apparatus according to claim 1, wherein said insulator portion has a characteristic of being converted into a conductor by ultraviolet irradiation.

8. The array substrate for a display apparatus according to claim 1, wherein said oxide semiconductor film includes an oxide semiconductor containing InGaZnO, InZnO, InGaO, InSnO, InSnZnO, InGaZnSnO, InAlZnO, InHfZnO, InZrZnO, InMgZnO, or InYZnO.

9. A display apparatus comprising the array substrate for a display apparatus according to claim 1.

10. The display apparatus according to claim 9, further comprising:
    a color filter substrate disposed above said insulating substrate; and
    a black matrix disposed on a lower surface of said color filter substrate,
    wherein said black matrix is not disposed above a position in said insulating film that corresponds to said insulator portion in a plan view.

11. An array substrate for a display apparatus, comprising:
    an insulating substrate that is transparent;
    an insulating film at least partly disposed on an upper surface of said insulating substrate and containing silicon oxide or metal oxide as a main component;
    a first conductive film;
    a second conductive film spaced apart from said first conductive film;
    an insulator portion that is in direct contact with and extends between said first conductive film and said second conductive film, said insulator portion being formed by converting an oxide semiconductor film into an insulator; and
    a transistor,
    wherein said insulator portion includes an upper surface or a lower surface in direct contact with said insulating film,
    wherein said first conductive film is connected to a drain electrode of said transistor, and
    wherein said second conductive film is connected to a gate wire of said transistor.

12. An array substrate for a display apparatus, comprising:
    an insulating substrate that is transparent;
    an insulating film at least partly disposed on an upper surface of said insulating substrate and containing silicon oxide or metal oxide as a main component;
    a first conductive film;
    a second conductive film spaced apart from said first conductive film; and
    an insulator portion that is in direct contact with and extends between said first conductive film and said second conductive film, said insulator portion being formed by converting an oxide semiconductor film into an insulator,
    said array substrate for a display apparatus having a fringe field switching (FFS) structure,
    said array substrate for a display apparatus further comprising a transistor,
    wherein said insulator portion includes an upper surface or a lower surface in direct contact with said insulating film,
    wherein said first conductive film is connected to a drain electrode of said transistor, and
    wherein said second conductive film is connected to a common electrode.

* * * * *